(12) United States Patent
Zhang et al.

(10) Patent No.: US 7,996,162 B1
(45) Date of Patent: Aug. 9, 2011

(54) DETECTION OF SHORTED OUTPUT PINS

(75) Inventors: Wendy Zhang, Farmington Hills, MI (US); Arnold H. Spieker, Commerce Township, MI (US)

(73) Assignee: Kelsey-Hayes Company, Livonia, MI (US)

( * ) Notice: Subject to any disclaimer, the term of this patent is extended or adjusted under 35 U.S.C. 154(b) by 401 days.

(21) Appl. No.: 12/203,585

(22) Filed: Sep. 3, 2008

Related U.S. Application Data

(60) Provisional application No. 61/072,257, filed on Mar. 28, 2008.

(51) Int. Cl.
*G01R 31/28* (2006.01)
*H03K 19/173* (2006.01)

(52) U.S. Cl. ............................................. 702/58; 326/38

(58) Field of Classification Search .................... 702/57, 702/58; 701/34, 114, 115; 326/38
See application file for complete search history.

(56) References Cited

U.S. PATENT DOCUMENTS

| | | | |
|---|---|---|---|
| 6,051,979 A | 4/2000 | Chandler et al. | |
| 6,940,299 B1 | 9/2005 | Lim et al. | |
| 7,049,842 B2 | 5/2006 | Lopezdenava | |
| 7,075,307 B1 | 7/2006 | Williamson | |
| 7,106,097 B2 * | 9/2006 | Whetsel | 326/38 |
| 2005/0134301 A1 | 6/2005 | Lopezdenava | |
| 2009/0277244 A1 * | 11/2009 | Doll et al. | 73/1.37 |

* cited by examiner

*Primary Examiner* — Bryan Bui
(74) *Attorney, Agent, or Firm* — MacMillan, Sobanski & Todd, LLC

(57) ABSTRACT

The rates of change and difference between signals sensed at adjacent electronic module output ports are determined and compared to criteria to determine whether the output ports are shorted.

18 Claims, 8 Drawing Sheets

DETECTION OF SHORTED OUTPUT PINS

CROSS-REFERENCE TO RELATED APPLICATIONS

This application claims the benefit of U.S. Provisional Application No. 61/072,257, filed Mar. 28, 2008, the disclosure of which is incorporated herein by reference.

BACKGROUND OF THE INVENTION

This invention relates in general to testing of electronic modules and in particular to detection of shorted output pins on an inertial sensor package.

Electronic brake control systems for vehicles are becoming increasing sophisticated. Such braking systems usually include an Anti-Lock Brake System (ABS) and a Traction Control (TIC) System. Additionally, a Vehicle Stability Control (VSC) System may be provided. A VSC System typically monitors vehicle motion parameters and is operable to selectively activate the vehicle wheel brakes and/or modify engine performance to avoid potential unwanted vehicle motions, such as, for example, a vehicle roll-over. A plurality of motion sensors, such as accelerometers and angular rate sensors are utilized to sense vehicle motion. The signals generated by the motion sensor elements are typically modified by a signal conditioning circuit and then provided to a microprocessor in an Electronic Control Unit (ECU) of the electronic brake control system. The ECU microprocessor utilizes a stored algorithm to monitor the vehicle motion parameters, and, upon detecting a potential vehicle stability problem, the microprocessor initiates corrective action.

The motion sensors are typically packaged with supporting circuitry, with the package containing one or more accelerometers and/or one or more angular rate sensors. The sensor packages may also include signal conditioning circuitry. Key to successful operation of the VSC system is proper functioning of the motion sensors and signal conditioning circuitry. Typically, the output pins for the motion sensors are physically located to next to one another. Thus, there is a potential for the output pins to short out, either internally or externally. If the pins are shorted, an output signal will continue to be produced, but the output signal would be inaccurate. Accordingly, sensor modules are tested prior to installation in a vehicle subsystem and subjected to further testing with Built In Tests (BIT's) during operation subsequent to installation for potential output pin shorting. However, such BIT's may be limited. Therefore, it would be desirable to provide additional testing to assure that the output pins have not been shorted together.

SUMMARY OF THE INVENTION

This invention relates to detection of shorted output pins on an inertial sensor package.

The invention contemplates a method for detecting shorted output pins on an electronic module that includes providing an electronic module having at least two output pins and sampling an output signal on each of the two output pins at a predetermined rate over a period of time. The difference between the output signals and a rate of change with respect to time for each of the output signals is calculated at each of the sampling times. A ratio of the rates of change is also calculated. The method then selects at least one of the calculated parameters for comparison to a decision criteria to determine whether or not a shorted output pin error flag should be set.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

The present invention contemplates a test method that includes sampling the output pins, or ports, for a motion sensor module, or package, that are being tested. The rates of change of the signals appearing at the sampled output pins are calculated and a ratio of the rates of change also is calculated. Additionally the difference between the output pin signals is computed. Selected ones of these calculated values are then compared to corresponding thresholds to determine whether or not the pins are shorted together. If the comparison fails, an error flag is set. The method also contemplates an optional feature that would require that the error condition continue for a period of time before the error flag is set.

Figure 1:
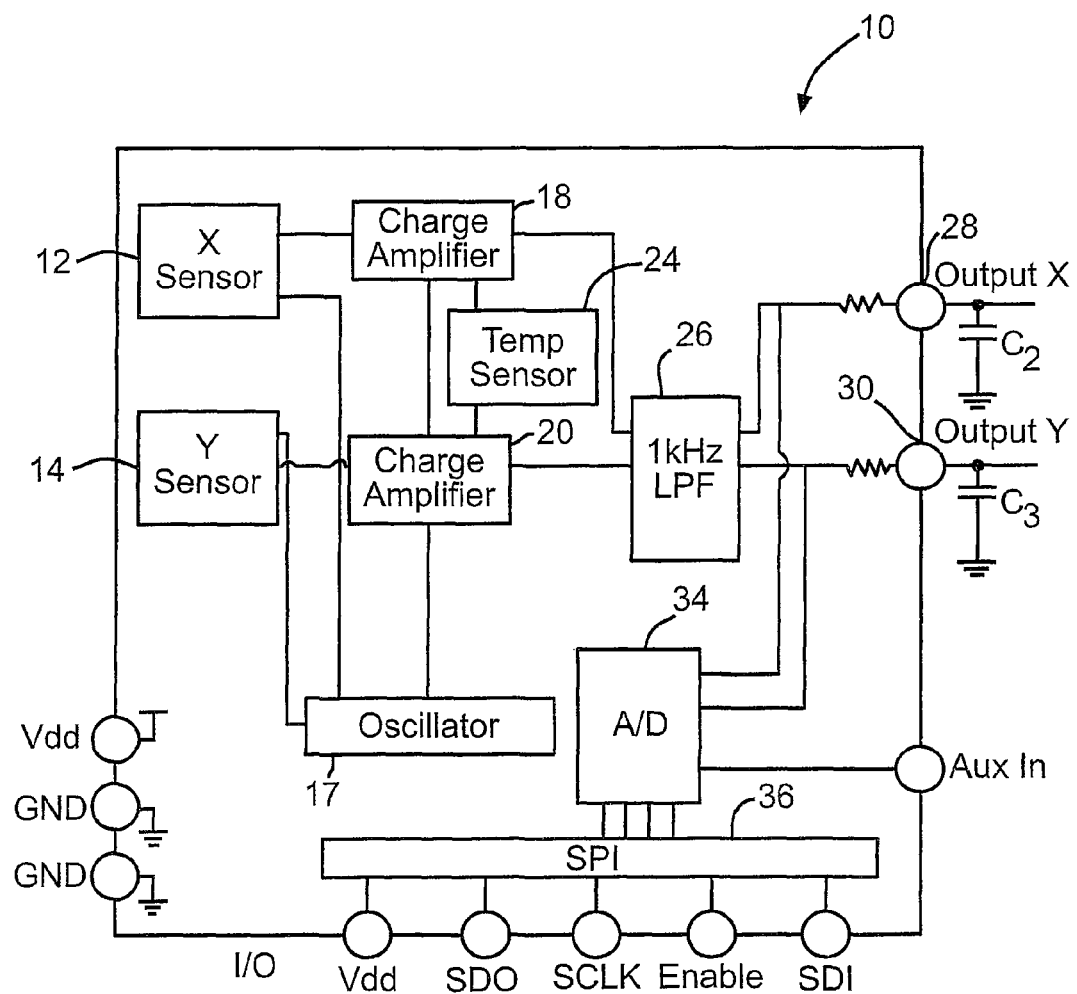
FIG. 1 is a block diagram of a typical motion sensor module.

Referring now to the drawings, there is illustrated in FIG. 1 a block diagram of a typical motion sensor 10. The motion sensor module 10 shown in FIG. 1 includes two accelerometers, or inertial sensors, that are labeled 12 and 14 and are utilized to measure acceleration along two perpendicular axes designated as X and Y, respectively. Typically, the X axis corresponds to the longitudinal axis of a vehicle while the Y axis corresponds to the lateral axis of the vehicle. While two accelerometers are shown in FIG. 1, it will be appreciated that the invention also may be practiced with motion sensor modules that include more than two accelerometers, such as modules that include an accelerometer for measuring motion along a vertical, or Z, axis. The accelerometers 12 and 14 are excited by an internal oscillator 17 and function on the principal of a differential capacitance arising from acceleration-induced motion of sense elements. The output of each of the accelerometers 12 and 14 is electrically connected to a charge amplifier, labeled 18 and 20, respectively, that amplifies the output signal generated by the corresponding accelerometer. The charge amplifiers for the sensor module 10 shown in FIG. 1 provide temperature compensation to the acceleration signals. Accordingly, each of the charge amplifiers 18 and 20 is electrically connected to a temperature sensor 24. The output signals from each of the charge amplifiers 18 and 20 passes through a one KHz low pass filter 26.

The motion sensor module 10 includes two methods for output of the final acceleration signals. Analog signals are available at two analog signal output pins that are labeled 28 and 30 and are connected through the sensor signal conditioning circuitry to the X and Y acceleration sensors, respectively. Alternately, the analog output signals pass through an Analog to Digital (A/D) converter 34 and the resulting digital signals are then supplied to a Serial Peripheral Interface (SPI) 36 for digital communication. The SPI 36 may be utilized to provide synchronous serial communication between the sensor module 10 and the electronic brake system microprocessor (not shown). Use of the SPI 36 allows the microprocessor to control multiple modules, such as the sensor module 10 in a master-slave configuration.

The SPI 36 shown in FIG. 1 is a four wire synchronous serial interface that uses two control and two data lines. With respect to the microprocessor, a common serial clock signal is supplied to a clock input pin labeled "SCLK" on the SPI 36 and data from the microprocessor is supplied to all slave units through a data input pin labeled "SDI". The microprocessor generates an independent chip select signal that is applied to an enable pin labeled "Enable" on the SPI 36. The enable pin Enable goes low at the start of a data transmission and then goes back to high at the end of the data transmission. The output of the sensor module 10 appears at a slave data output pin labeled "SDO" that remains in a high impedance state when the module 10 is not selected to output data so as to not interfere with any active devices. Also shown in FIG. 1 are pins labeled $V_{dd}$ for supplying a power supply voltage $D_{VD}$ to components within the sensor module 10 and ground pins labeled "GND".

The sensor module 10 does not include a self test input pin, but the module does include an Auxiliary Input pin labeled "Aux in". The Auxiliary Input pin is intended to utilize the Analog to Digital converter 34 in the sensor module 10 to reduce the Analog to Digital signal conversion load on the master microprocessor. For example, a digital accelerometer, such as the module 10, could receive an analog output signal from a rotational rate sensor (not shown), convert it to a digital signal and send the converted signal in a serial data format with the digital accelerometer data to the microprocessor over a digital bus (not shown). While the sensor module 10 is illustrated in block diagram form in FIG. 1, it will be appreciated that the module would typically be fabricated as an Applied Specific Integrated Circuit (ASICS). Alternately, specific portions of the module may be ASIC's that are combined with discrete electronic components. Additionally, the sensor module 10 is meant to be exemplary, it is contemplated that the invention also may be practiced with devices other than the one shown in FIG. 1.

Figure 2:
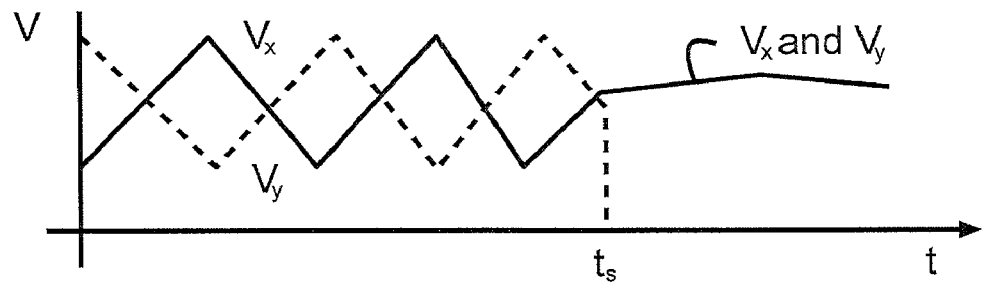
FIG. 2 illustrates typical ideal voltages that are available at the output pins of the motion sensor shown in FIG. 1.

FIG. 2 illustrates typical ideal output voltages at pins 28 and 30 of the motion sensor 10 shown in FIG. 1. In FIG. 1, the voltage labeled $V_x$ represents the voltage at pin 28 and the voltage labeled $V_y$ represents the voltage at pin 30. At $t_S$, the pins 28 and 30 are shorted and the outputs become the same. The shorting of the pins 28 and 30 may occur internally or externally of the motion sensor 10.

Figure 3:
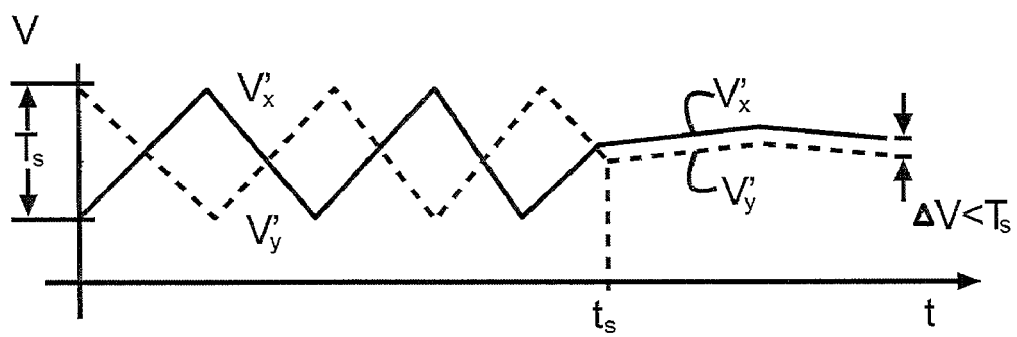
FIG. 3 illustrates typical actual voltages that are available at the output pins of the motion sensor shown in FIG. 1.

FIG. 3 illustrates actual output voltages $V'_x$ and $V'_y$ with the voltages having different magnitudes, but tracking each other, after $t_s$. Because the output voltages may differ after the pins are shorted, an error criteria for detecting the shorted pins is the difference between the voltages, $\Delta V$. The present invention contemplates comparing the voltage difference $\Delta V$ to a shorted pin voltage threshold, $T_S$. If the voltage difference $\Delta V$ is less than the shorted pin voltage threshold, $T_S$, it would be an indication that the pins are shorted. However, if the shorted pin voltage threshold $T_S$ is set too large, it may also include the difference between the magnitudes of non-shorted output voltages. Accordingly, the present invention also contemplates utilizing the derivatives of the output voltages to detect shorted output pins.

Figure 4:
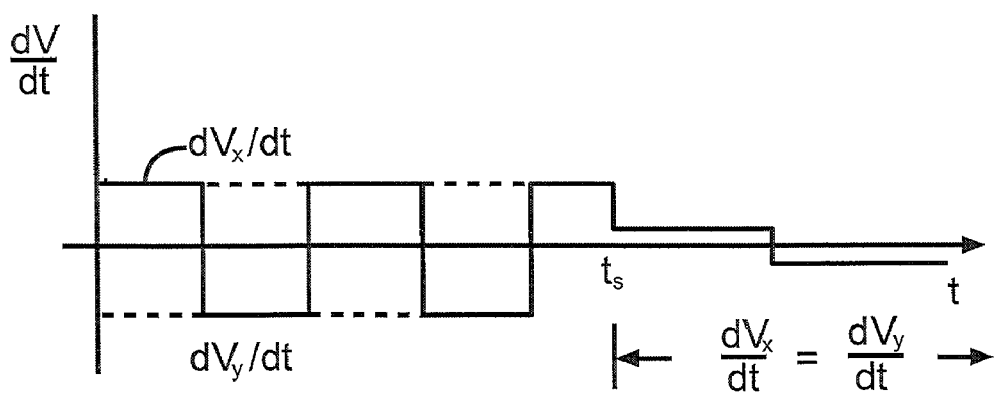
FIG. 4 illustrates the derivatives of the typical actual motion sensor output voltages that are shown in FIG. 3.

FIG. 4 illustrates the derivatives $dV'_x/dt$ and $dV'_y/dt$ of the actual output voltages $V'_x$ and $V'_y$ that are shown in FIG. 3. Because the actual output voltages track together, even though they have different magnitudes, after $t_S$, the derivatives of the output voltages will have the same slopes and hence track together after $t_S$, as shown in FIG. 4. Because there are variations in the values of the shorted output voltages $V'_x$ and $V'_y$ shown in FIG. 3, there are corresponding slope values shown in FIG. 4 after $t_S$, that is, the slope values of the derivatives of the output voltages are non-zero.

Figure 5:
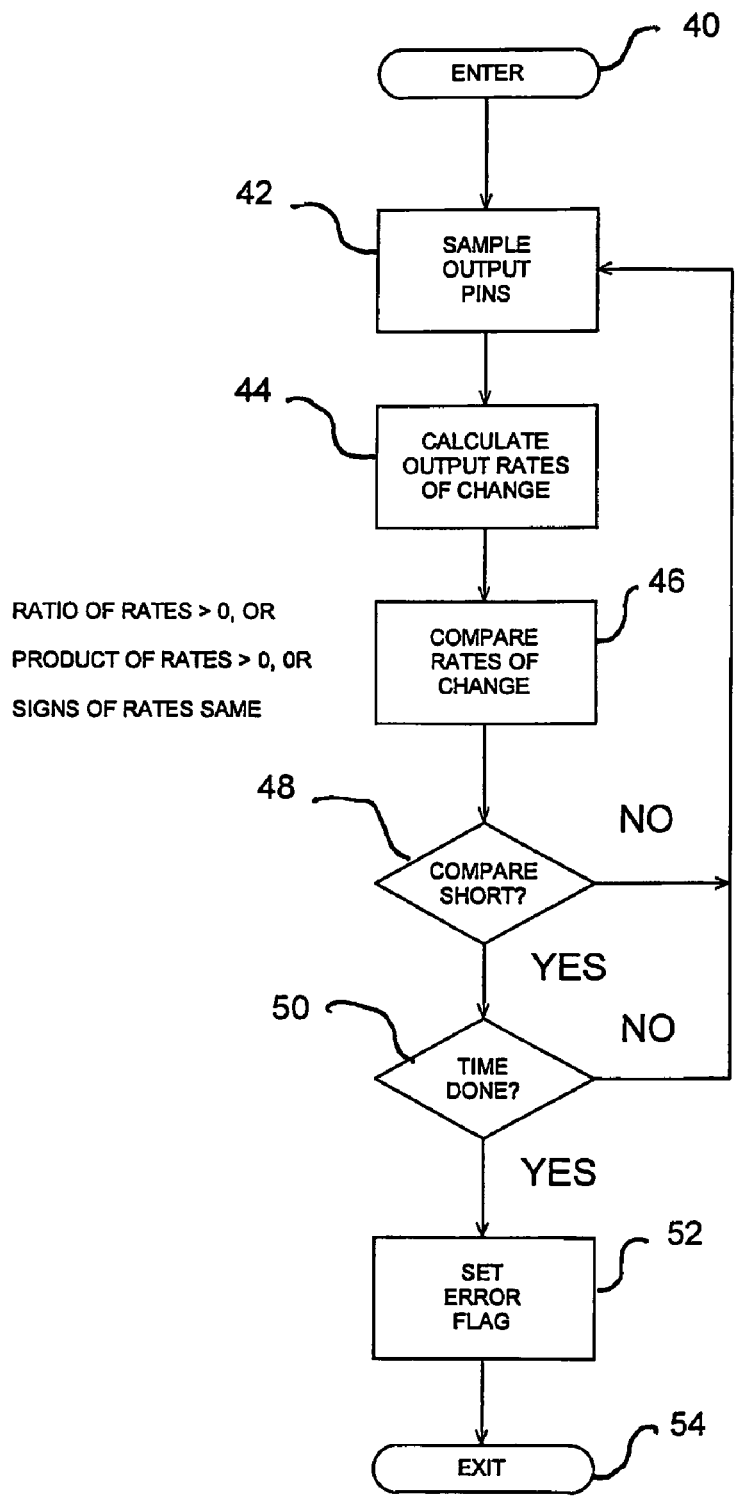
FIG. 5 is a flow chart for an algorithm for detecting shorted output pins in accordance with the invention.

An algorithm that is in accordance with the invention that utilizes the derivatives of the output signals to detect shorted output pin conditions is illustrated by the flow chart shown in FIG. 5. The algorithm calculates and compares the rates of change for signals appearing on adjacent output pins and is entered through block 40. The algorithm then advances to functional block 42 where the output voltages on a pair of adjacent output pins is sampled. The algorithm continues to functional block 44 where the rates of change are calculated for the voltages sampled in functional block 42. Typically, the rate of change is determined by dividing the difference between the voltage sampled in functional block 42 and the voltage sampled in the previous iteration by the time interval between the samples.

The rates of change are compared in functional block 46. The invention contemplates utilizing one of three criteria for determining whether a shorted output pin condition exists. The criteria are shown next to the "COMPARE RATES OF CHANGE" functional box 46. The criteria include (1) Is the ratio of the rates of change greater than zero;

(2) Is the product of the rates of change greater than zero; or (3) Are the signs of the rates of change the same?

Meeting any one of the above three criteria is indicative of the derivatives of the rates of change tracking together. Only one of the three criteria would be applied, hence, the flow chart shown in FIG. 5 represents three different embodiments of the invention.

The algorithm then advances to decision block 48 where it is determined whether or not the output pins are shorted together. If the pins are not shorted together, the algorithm transfers back to functional block 42 to begin another iteration of the algorithm. If the pins are indicated to be shorted together, the algorithm transfers to decision block 50.

In decision block 50, it is determined whether or not the shorted pin condition has continued to exist for a predetermined number of consecutive algorithm iterations. Thus, the intention of including decision block 50 is to avoid setting an error flag due to erroneous conditions existing on the output pins that may cause a false indication of shorted pins, such as noise causing a false reading. It is contemplated that a counter that is incremented when shorted pins are detected in decision block 48 may be utilized. The counter value would then be compared to a threshold to determine whether the fault has been present for the predetermined time. However, other methods also may be used. Additionally, if such a counter is used, it would be necessary to reset the counter upon a fault not being present in decision block 48 (not shown). If, in decision block 50, the shorted condition has not been present for the predetermined time period, the algorithm transfers back to functional block 42 to begin another iteration of the algorithm. If, on the other hand, the shorted condition has been present for the predetermined time period, the algorithm transfers to functional block 52 where an error flag is set. The algorithm then exits through block 54.

It is noted that decision block 50 is optional and that the invention also may be practiced without decision block 50; however, omission of decision block 50 will trigger the setting of an error flag upon a single occurrence of one of the shorted pin criteria.

Figure 6:
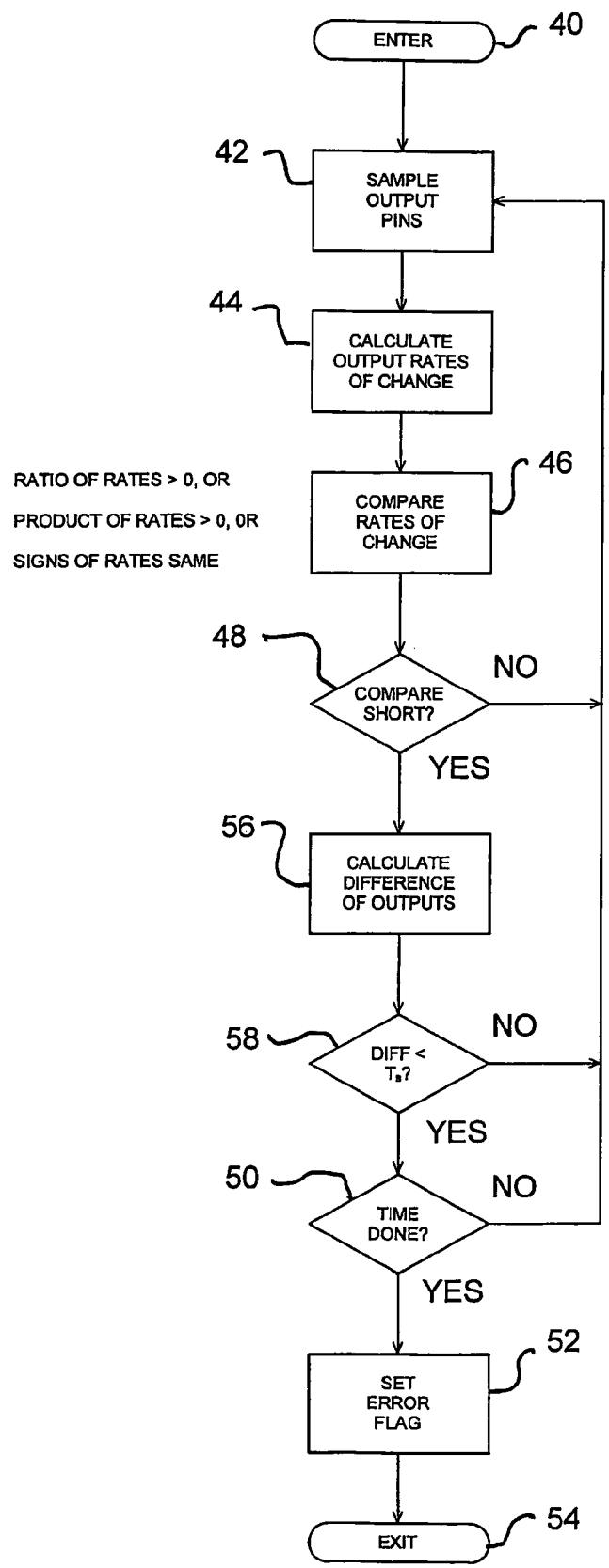
FIG. 6 is an alternate embodiment of the flow chart shown in FIG. 5 that includes comparing the difference between the output pin voltages.

In FIG. 6, an alternate embodiment of the algorithm shown in FIG. 5 is illustrated with blocks that are similar to blocks shown in FIG. 5 having the same numerical identifiers. In FIG. 6, a second shorted pin test is added with the difference between the output signals being calculated and compared to a threshold $V_S$ after the rates of change are compared. An error flag is set only after both tests indicate that a short is present. Thus, the algorithm is entered through block 40 and continues through decision block 48 as described above. However, upon determining in decision block 48 from a comparison of the derivatives of the output pin voltages that an error condition is present, the algorithm transfers to functional block 56 where the voltage difference $\Delta V$ of the output pin voltages $V'_x$ and $V'_y$ sampled in functional block 42 is calculated. The algorithm then advances to decision block 58 where the output voltage difference $\Delta V$ is compared to the shorted pin voltage threshold $T_S$. As described above, if the voltage difference $\Delta V$ is less than the shorted pin voltage threshold, $T_S$, it would be an indication that the pins are shorted and the algorithm transfers to decision block 50 and continues as described above for FIG. 5. However, if the voltage difference $\Delta V$ is greater than, or equal to, the shorted pin voltage threshold, $T_S$, the algorithm transfers back to functional block 42 to begin the next iteration. As also described above, decision block 50 is optional and, if included, the counter would be reset if either of decision blocks 48 or 58 caused the algorithm to return to functional block 42 to begin another iteration (not shown). Again, one of three different criteria is applied decision block 46. Therefore, the flow chart shown in FIG. 6 represents three different embodiments of the invention.

Figure 7:
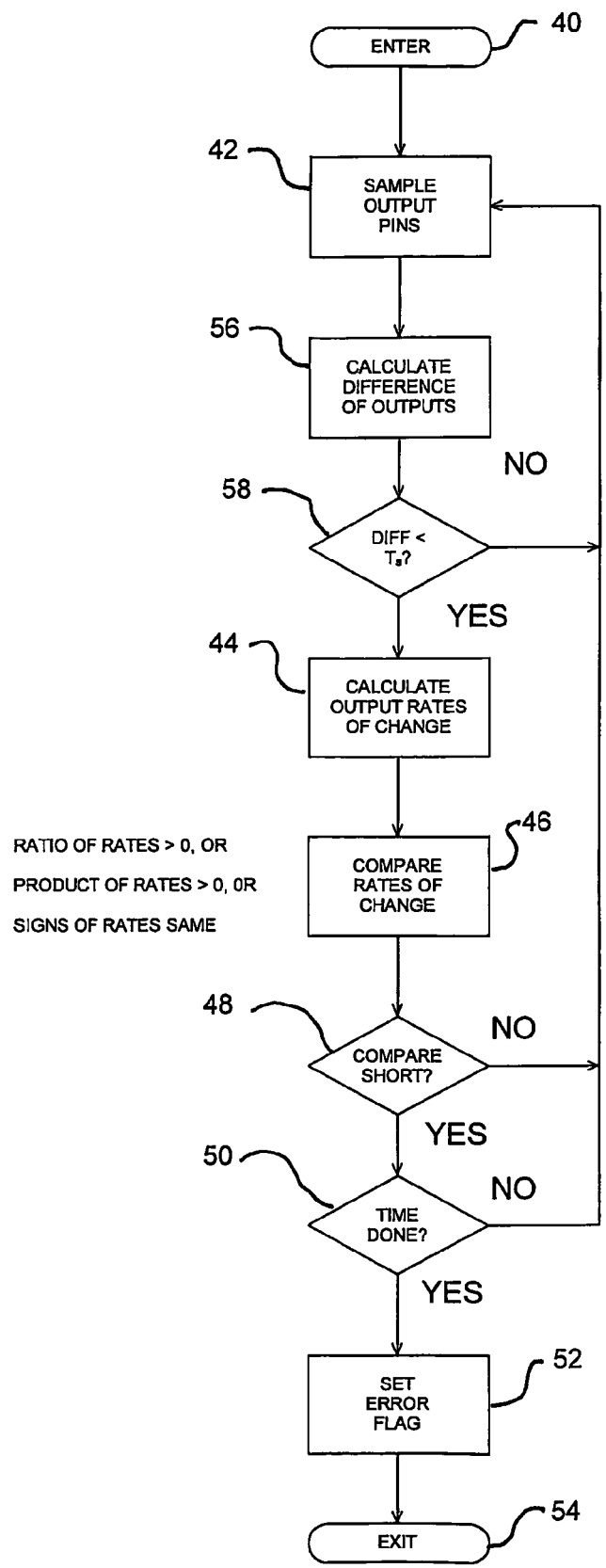
FIG. 7 is an alternate embodiment of the flow chart shown in FIG. 6.

In FIG. 7, another alternate embodiment of the algorithm shown in FIG. 5 is illustrated with blocks that are similar to blocks shown in FIGS. 5 and 6 having the same numerical identifiers. The algorithm illustrated in FIG. 7 again uses the two tests described for FIG. 6, but the sequence of the tests in FIG. 6 is reversed with the difference in the output signals being checked before the rates of change are compared. As before, one of three different criteria is applied decision block 46. Therefore, the flow chart shown in FIG. 7 represents three different embodiments of the invention. Similarly, the timer represented by decision block 50 is optional.

Figure 8:
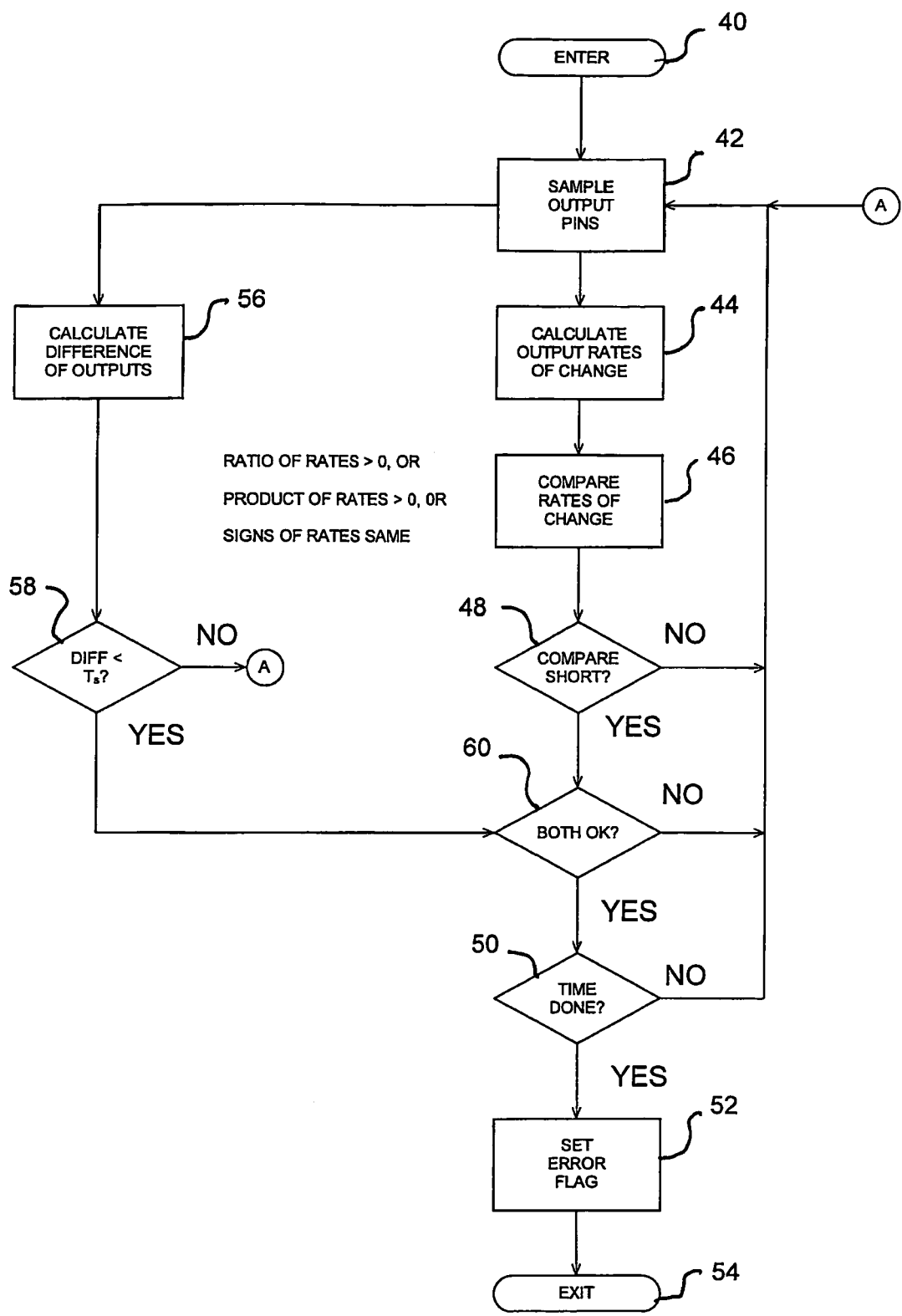
FIG. 8 is another alternate embodiment of the flow chart shown in FIG. 6.

Another embodiment of the invention is shown in FIG. 8, where blocks that are similar to blocks shown in FIGS. 5 through 7 have the same numerical identifiers. In FIG. 8, both the rate and difference calculations are done simultaneously. Thus, the algorithm follows parallel paths after sampling the output pins in functional block 42. Failure of either of the test criteria in decision blocks 48 and 58 will return the algorithm to functional block 42 and start another iteration of the algorithm. As shown in FIG. 8, the algorithm includes a second check in decision block 60 that allows continuation toward the setting of an error flag only if both test criteria are met in decision blocks 48 and 58. This provides a redundancy and the invention also may be practiced with decision block 60 omitted. If decision block 60 is omitted, the YES branches of decision blocks 48 and 58 would transfer directly to decision block 50 (not shown). As before, one of three different criteria is applied decision block 46. Therefore, the flow chart shown in FIG. 8 represents three different embodiments of the invention. Similarly, the timer represented by decision block 50 is again optional.

Figure 9A:
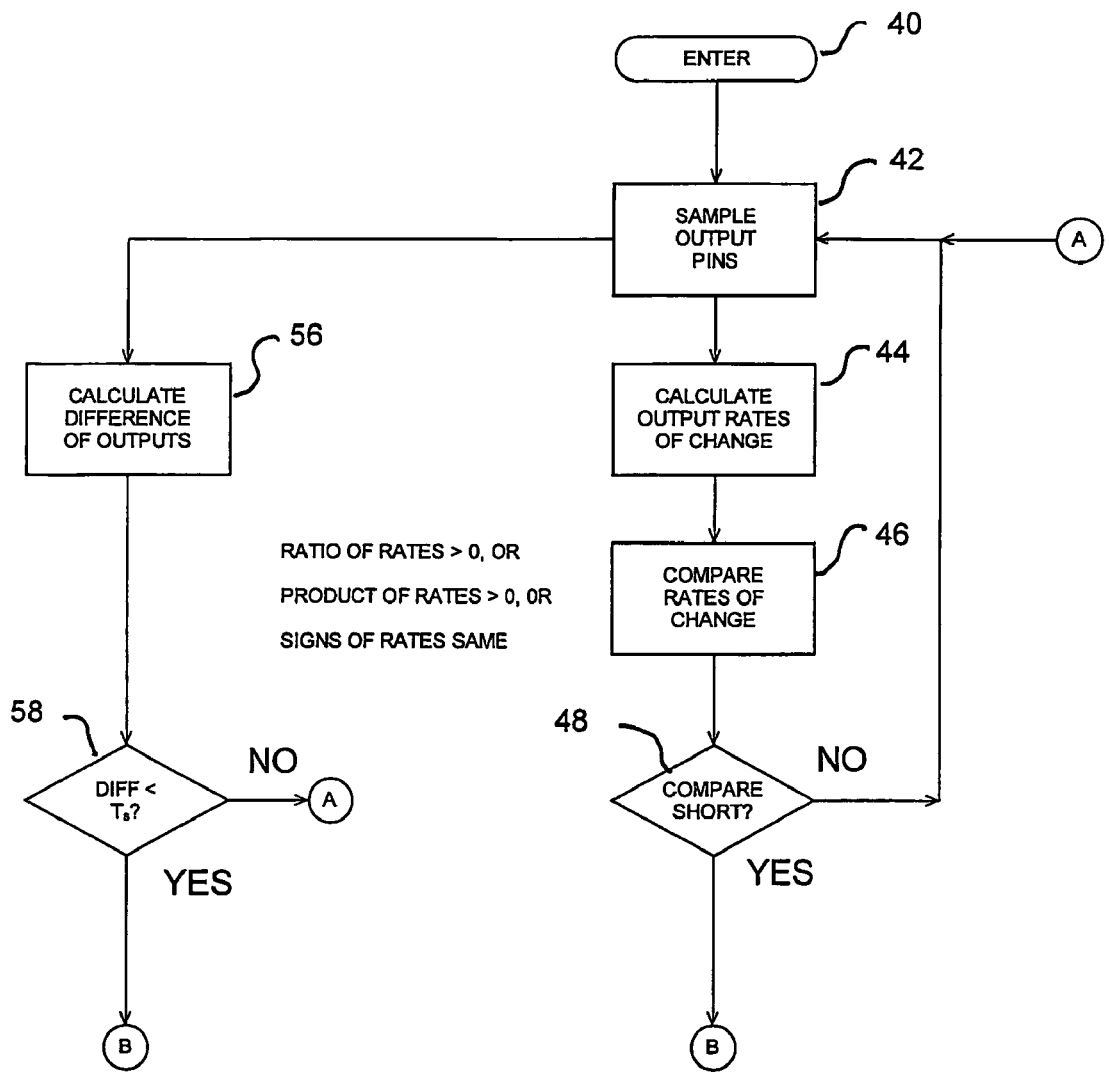
FIGS. 9A and 9B illustrate an alternate embodiment of the flow chart shown in FIG. 8.
Figure 9B:
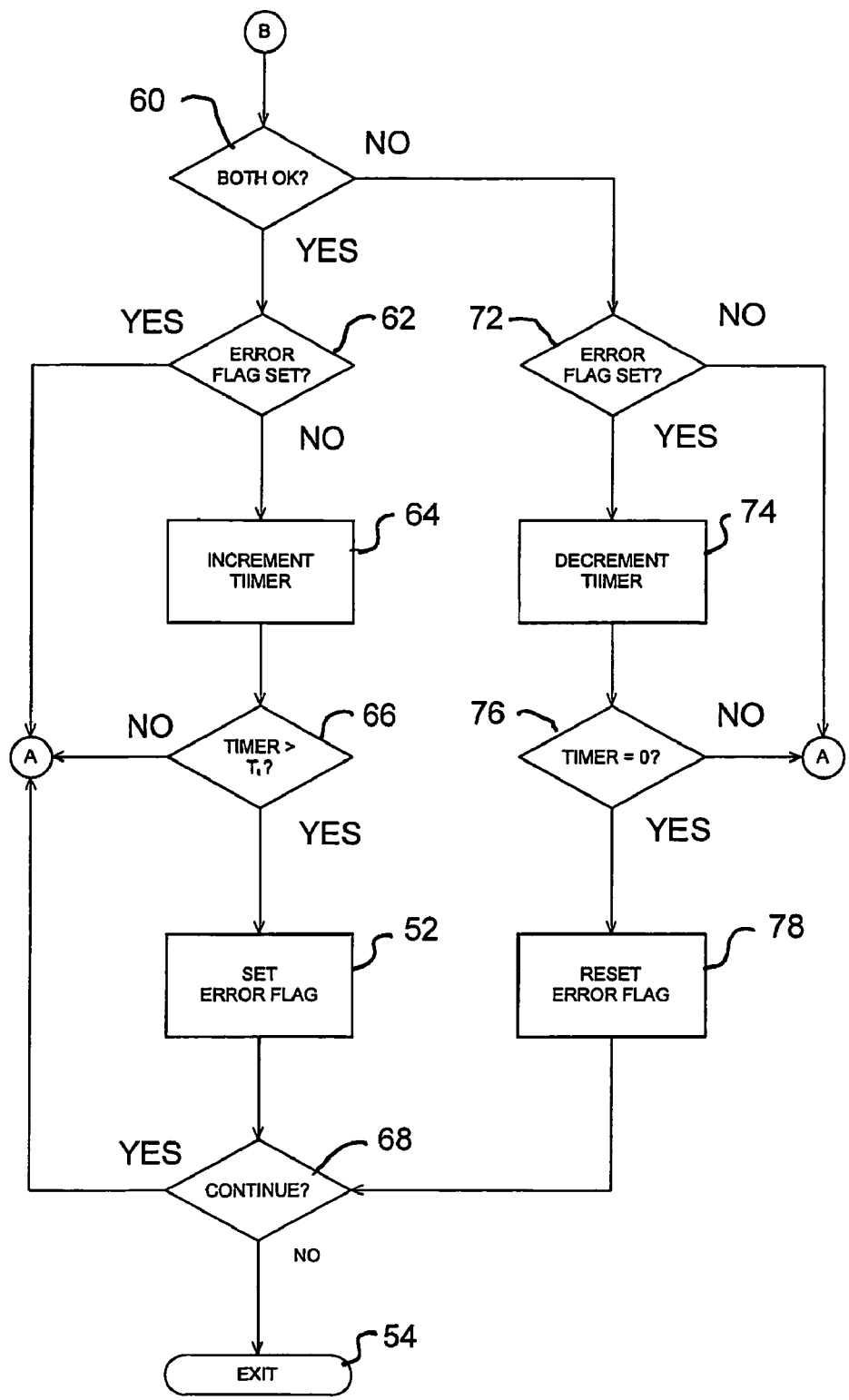

Yet another embodiment of the invention is illustrated by the flow charts shown in FIGS. 9A and 9B, where blocks that are similar to blocks shown in FIGS. 5 through 8 have the same numerical identifiers. FIG. 9A repeats the calculation portion of the algorithm shown in FIG. 8 while FIG. 9B expands the timer, or counter, portion of FIG. 8 to illustrate incrementing and decrementing a timer, or counter. Thus, in FIG. 9B, the algorithm reaches decision block 60 and checks whether both test criteria for shorted outputs have been met. If both criteria have been met, the algorithm advances along the left branch shown in FIG. 9B by transferring to decision block 62.

In decision block 62 the status of the shorted output error flag is checked. If the error flag is set, the algorithm transfers back to functional block 42 in FIG. 9A to begin another iteration. If the error flag is not set, the algorithm transfers from decision block 62 to functional block 64 where the timer, or counter, is incremented. The algorithm then continues to decision block 66.

In decision block 66, the contents of the timer, or counter, is compared to a timer threshold $T_t$. If the contents of the counter is less than or equal to the timer threshold $T_t$, the fault condition has not existed long enough to set the error flag and the algorithm transfers back to functional block 42 in FIG. 9A to begin another iteration. If, on the other hand, the content of the counter is greater than the timer threshold $T_t$, the fault condition has existed long enough to set the error flag and the algorithm transfers to functional block 52, where the error flag is set. The algorithm continues to decision block 68 where it is determined whether or not the algorithm should continue. Continuation criteria for decision block 68 may be related to vehicle operation parameter, such as, for example, whether the vehicle ignition is on; however, other criteria also may be utilized. If, in decision block 68, it is determined to continue, the algorithm transfers back to functional block 42 in FIG. 9A to begin another iteration. If it is decided to not continue, the algorithm exits through block 54.

Returning now to decision 60, if both error conditions are not met, the algorithm advances along the right branch shown in FIG. 9B by transferring to decision block 72. In decision block 72 the status of the shorted output error flag is checked. If the error flag is not set, the algorithm transfers back to functional block 42 in FIG. 9A to begin another iteration of the algorithm. If the error flag is set, the algorithm transfers from decision block 72 to functional block 74 where the timer, or counter, is decremented. The algorithm then continues to decision block 76.

In decision block 76, the content of the counter is compared to zero. If the content of the counter is not equal to zero, the counter has not been zeroed and the algorithm transfers back to functional block 42 in FIG. 9A to begin another iteration of the algorithm. If, on the other hand, the content of the counter is equal to zero, the fault has been cleared for a sufficient number of iterations to clear the error flag and the algorithm transfers to functional block 78, where the error flag is set. The algorithm then advances to decision block 68 and continues as described above.

As described above and illustrated in FIG. 9B, the algorithm counts both up and down for setting and resetting the error flag. The invention also contemplates resetting the error flag and counter when a single cleared fault condition is detected (not shown). Additionally, the invention also may be practiced with different time periods for setting and clearing the error flag (not shown). Also, as shown in FIG. 9A, one of three different criteria may be applied in decision block 46. Therefore, the flow chart shown in FIGS. 9A and 9B represents three different embodiments of the invention. Furthermore, the setting and clearing of the error flag that is shown in FIG. 9B also may be applied to the flow charts shown in FIGS. 5 through 8 (not shown).

It will be appreciated that the flow charts described above are intended to be exemplary and that the invention also may be practiced with algorithms described by flow charts other than the ones shown in FIGS. 5 through 9. Additionally, while the invention was illustrated and described for a device having two output ports, or pins, it will be appreciated that the invention also may be practiced for devices having more than two output pins by sampling the output pins two at a time (not shown). Furthermore, the invention may be applied to non-adjacent pins to detect internal shorts. Similarly, while the invention was illustrated and described for a motion sensor module, the invention also may be practiced with any electronic device having two or more output pins or ports (not shown).

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A method for detecting shorted output pins on an electronic module, the method comprising:
    (a) providing an electronic module having at least two output pins;
    (b) sampling an output signal on each of the two electronic module output pins at a predetermined rate over a period of time;
    (c) calculating a rate of change with respect to time for each of the output signals sensed in step (b) at each of the sampling times;
    (d) calculating a ratio of the rates of change for each of the output signals at each of the sampling times;
    (e) calculating the difference between the output signals at each of the sampling times; and
    (f) selecting at least one of the calculated parameters for comparison to a decision criteria over the period of time to determine whether an error flag is to be set to indicate that a short circuit exists between the electronic module output pins sampled in step (b).

2. The method according to claim 1 wherein the decision criteria in step (f) includes a ratio threshold and a difference threshold and further wherein step (f) includes the following sub-steps:
    (f1) comparing the ratio of the rates of change for each of the output signals calculated in step (d) to the ratio threshold; and
    (f2) upon the ratio of the rates of change being greater than the ratio threshold, comparing the difference of the output signals calculated in step (e) to the difference threshold; and
    (f3) upon the differences of the output signals remaining less than the difference threshold for the period of time, setting the error flag.

3. The method according to claim 2 wherein the time period is a first time period and further wherein, upon the ratio of the rates of change calculated in step (c) remaining one of less than and equal to the difference threshold for a second time period, the error flag is reset.

4. The method according to claim 1 wherein the decision criteria in step (f) includes a difference threshold and a ratio threshold and further wherein step (f) includes the following sub-steps:
    (f1) deferring steps (c) and (d) until after the differences of the output signals calculated in step (e) have remained less than the difference threshold for the period of time; and
    (f2) calculating the rates of change and the ratio of the rates of change for each of the output signals at the end of the period of time; and
    (f3) comparing the ratio of the rates of change to the ratio threshold; and
    (f4) setting the error flag upon the ratio of the rates of change being greater than the ratio threshold.

5. The method according to claim 4 wherein the time period is a first time period and further wherein, upon the differences of the output signals calculated in step (e) remaining one of greater than and equal to the difference threshold for a second time period, the error flag is reset.

6. The method according to claim 1 wherein the decision criteria in step (f) includes a ratio threshold and a difference threshold and further wherein step (f) includes the following sub-steps:
    (f1) deferring step (e) until after the ratios of the rates of change for each of the output signals calculated in step (c) have remained greater than the ratio threshold for the period of time; and
    (f2) calculating the difference of the output signals at the end of the period of time; and
    (f3) comparing the difference to the output signals to the difference threshold; and
    (f4) setting the error flag upon the difference of the output signals being less than the difference threshold.

7. The method according to claim 6 wherein the time period is a first time period and further wherein, upon the ratio of the rates of change calculated in step (c) remaining one of less than and equal to the ratio threshold for a second time period, the error flag is reset.

8. The method according to claim 1 wherein the decision criteria in step (f) includes a difference threshold and further wherein step (f) includes the following sub-steps:
    (f1) comparing the ratio of the rates of change for each of the output signals for at least one sign change during the period of time; and
    (f2) upon the sign of the ratio of the rates of change changing, comparing the difference of the output signals calculated in step (e) to the difference threshold; and
    (f3) upon the differences of the output signals remaining less than the difference threshold for the period of time, setting the error flag.

9. A method for detecting shorted output pins on an electronic module, the method comprising:
    (a) providing an electronic module having at least two output pins;
    (b) sampling an output signal on each of the two output pins at a predetermined rate over a period of time;
    (c) calculating a rate of change with respect to time for each of the output signals sensed in step (b) at each of the sampling times;
    (d) calculating a ratio of the rates of change for each of the output signals at each of the sampling times;
    (e) calculating the difference between the output signals at each of the sampling times; and
    (f) comparing the difference of the output signals calculated in step (e) to a difference threshold;

(g) comparing the ratio of the rates of change for each of the output signals calculated in step (d) to the ratio threshold upon the difference of the output signals being less than the difference threshold; and (h) setting an error flag upon the ratio of the rates of change remaining greater than a ratio threshold for the period of time.

10. The method according to claim 9 wherein the time period is a first time period and further wherein, upon the difference of the output signals calculated in step (e) remaining one of greater than and equal to the difference threshold for a second time period, the error flag is reset.

11. The method for detection according to claim 10 wherein the difference of the output signals is determined in step (e) only if either of the output signals is greater than an output signal threshold.

12. The method for detection according to claim 11 wherein the output signals are filtered before determining the difference of the output signals.

13. The method for detection according to claim 12 wherein the first period of time is a function of the length of time that the rate of change associated with one of the output pins exceeds zero.

14. The method according to claim 13 wherein the electronic module is a sensor module and further wherein each of the output pins is connected to a motion sensor.

15. A method for detecting shorted output pins on an electronic module, the method comprising:

(a) providing an electronic module having at least two output pins;

(b) sampling an output signal on each of the two output pins at a predetermined rate over a period of time;

(c) calculating a rate of change with respect to time for each of the output signals sensed in step (b) at each of the sampling times;

(d) multiplying the rates of change for each of the output signals calculated in step (c) together; and (e) monitoring the sign of the resulting product of the rates of change; and (f) calculating the difference of the output signals at the end of the period of time if the signs of the product of the rates of change have remained the same over the period of time; and (g) comparing the difference of the output signals to a difference threshold and, (h) setting an error flag upon the difference of the output signals being less than the difference threshold.

16. The method according to claim 15 wherein the time period is a first time period and further wherein, upon the signs of the product of the rates of change changing relative to one another at least once over a second time period, the error flag is reset.

17. A method for detecting shorted output pins on an electronic module, the method comprising:

(a) providing an electronic module having at least two output pins;

(b) sampling an output signal on each of the two electronic module output pins at a predetermined rate;

(c) calculating a rate of change with respect to time for each of the output signals sensed in step (b) at each of the sampling times;

(d) calculating a ratio of the rates of change for each of the output signals at each of the sampling times;

(e) the ratio of the rates of change is compared to a decision criteria over the period of time to determine whether an error flag is to be set to indicate that a short circuit exists between the electronic module output pins sampled in step (b).

18. The method according to claim 17 in which the output signals are sampled in step (b) over a period of time and, in step (e), the ratio of the rates of change is compared to the decision criteria over the period of time to determine whether an error flag is to be set.

* * * * *